United States Patent
Danjo

(10) Patent No.: US 9,331,685 B2
(45) Date of Patent: May 3, 2016

(54) COMPARATOR SYSTEM

(71) Applicant: FUJITSU LIMITED, Kawasaki-shi, Kanagawa (JP)

(72) Inventor: Takumi Danjo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/681,376

(22) Filed: Apr. 8, 2015

(65) Prior Publication Data

US 2015/0333746 A1  Nov. 19, 2015

(30) Foreign Application Priority Data

May 13, 2014 (JP) .................. 2014-099754

(51) Int. Cl.
- H03K 5/24 (2006.01)
- H03K 5/13 (2014.01)
- H03F 3/00 (2006.01)
- H03M 1/06 (2006.01)

(52) U.S. Cl.
CPC .................. *H03K 5/24* (2013.01); *H03F 3/005* (2013.01); *H03K 5/131* (2013.01); *H03K 5/249* (2013.01); *H03M 1/0604* (2013.01); *H03F 2200/375* (2013.01)

(58) Field of Classification Search
CPC ..... H03K 5/24; H03K 19/0175; H03K 5/131; H03K 5/2481; H03K 5/249; G01D 5/24; H03F 2200/372; H03F 2200/375; H03F 3/005; H03M 1/0604
See application file for complete search history.

(56) References Cited

U.S. PATENT DOCUMENTS

| | | | |
|---|---|---|---|
| 7,692,459 B2* | 4/2010 | Lee | H03K 5/131 327/149 |
| 8,866,498 B2* | 10/2014 | Petkov | G01D 5/24 324/667 |
| 9,190,961 B1* | 11/2015 | Wan | H03F 1/0233 |
| 2006/0273804 A1* | 12/2006 | Delorme | G01D 5/24 324/658 |
| 2008/0030234 A1* | 2/2008 | Amamiya | H03K 3/2885 326/95 |
| 2011/0234440 A1 | 9/2011 | Danjo | |

FOREIGN PATENT DOCUMENTS

| | | |
|---|---|---|
| JP | 2011-223553 A | 11/2011 |
| JP | 2013-70156 A | 4/2013 |

* cited by examiner

*Primary Examiner* — Jung Kim
(74) *Attorney, Agent, or Firm* — Arent Fox LLP

(57) ABSTRACT

A comparator system includes: a clock node configured to supply a clock signal; a comparator configured to compare a signal of a first input node with a signal of a second input node in synchronization with the clock signal; and a first variable capacitance coupled between the first input node and the clock node.

10 Claims, 9 Drawing Sheets

COMPARATOR SYSTEM

CROSS-REFERENCE TO RELATED APPLICATION

This application is based upon and claims the benefit of priority of the prior Japanese Patent Application No. 2014-099754, filed on May 13, 2014, the entire contents of which are incorporated herein by reference.

FIELD

The embodiments discussed herein are related to a comparator system.

BACKGROUND

There has been known a comparator system including a comparator which has a pair of input nodes configured to receive input signals via capacitors and an output node configured to output an output signal indicating a voltage difference of the input signals. A first control circuit is configured to set a common voltage at the pair of input nodes. A second control circuit is configured to set an amount of load to be connected to the output node. A third control circuit is configured to supply a pair of input terminals with a first voltage and a second voltage, respectively, between which there is a certain voltage difference, in a correction period for correcting a threshold of the comparator. Here, the certain voltage difference corresponds to how much a threshold of a reference comparator changes upon connection of a predetermined amount of load to an output node of the reference comparator. In the correction period, with the predetermined amount of load connected to the output node, the first control circuit changes the common voltage until the logic of the output signal is inverted. Then, in a normal operation period following the correction period, the first control circuit uses the common voltage at which the logic of the output signal is inverted.

When the predetermined amount of load is connected to the output node of the comparator in order to correct the threshold of the comparator, the operating speed of the comparator is lowered.

The following is reference document:
[Document 1] Japanese Laid-open Patent Publication No. 2013-70156.

SUMMARY

According to an aspect of the invention, a comparator system includes: a clock node configured to supply a clock signal; a comparator configured to compare a signal of a first input node with a signal of a second input node in synchronization with the clock signal; and a first variable capacitance coupled between the first input node and the clock node.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
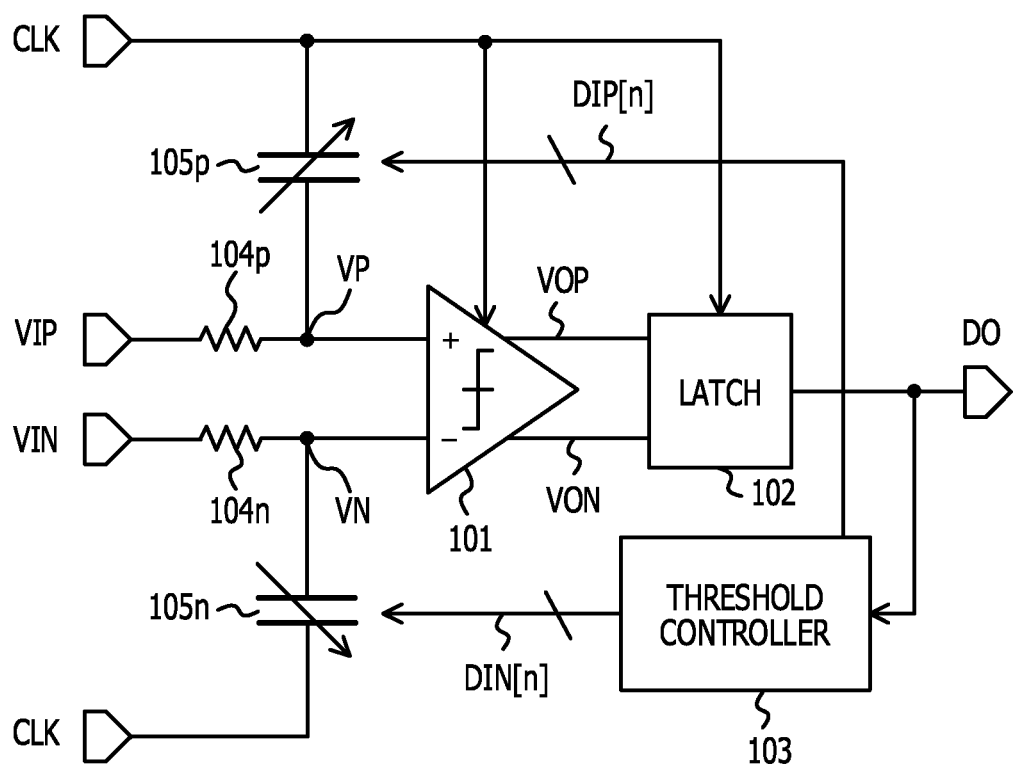
FIG. 1 is view illustrating a configuration example of a comparator system according to this embodiment.

FIG. 1 is a view illustrating a configuration example of a comparator system according to this embodiment. The comparator system has a comparator 101, a latch circuit 102, a threshold controller 103, a first resistance 104p, a second resistance 104n, a first variable capacitance 105p, and a second variable capacitance 105n. In synchronization with a clock signal supplied to a clock node CLK, the comparator system compares a signal of a third input node VIP with a signal of a fourth input node VIN and outputs a signal of a comparison result from an output node DO.

The clock node CLK is a node configured to supply a clock signal. A first input signal is inputted to the third input node VIP. A second input signal is inputted to the fourth input node VIN. The first resistance 104p is a wiring resistance, for example, and connected between a first input node VP and the third input node VIP. The second resistance 104n is a wiring resistance, for example, and connected between a second input node VN and the fourth input node VIN. The first variable capacitance 105p is connected between the first input node VP and the clock node CLK. The second variable capacitance 105n is connected between the second input node VN and the clock node CLK. The variable capacitances 105p and 105n may use a varactor diode. The resistances 104p and 104n may be deleted.

However, an RC time constant may be adjusted with the resistances 104p, 104n and the variable capacitances 105p, 105n. The comparator 101 has a positive-electrode input terminal connected to the first input node VP, a negative-electrode input terminal connected to the second input node VN, a clock terminal connected to the clock node CLK, a positive-electrode output terminal connected to a first output node VOP, and a negative-electrode output terminal connected to a second output node VON. In synchronization with a clock signal of the clock node CLK, the comparator 101 compares a signal of the first input node VP with a signal of the second input node VN and outputs signals of a comparison result to the first output node VOP and the second output node VON.

The signals which are inverted from each other in terms of logic are outputted to the first output node VOP and the second output node VON. Specifically, when the signal of the first input node VP is larger than the signal of the second input node VN, the comparator 101 outputs a high level to the first output node VOP and a low level to the second output node VON. On the other hand, when the signal of the first input node VP is smaller than the signal of the second input node VN, the comparator 101 outputs a low level to the first output node VOP and a high level to the second output node VON.

In synchronization with a clock signal of the clock node CLK, the latch circuit 102 latches a high level when a signal of the first output node VOP is larger than a signal of the second output node VON and a low level when the signal of the first output node VOP is smaller than the signal of the second output node VON to maintain output of the latched signal to the output node DO. In response to a signal of the output node DO, the threshold controller 103 outputs a multiple-bit control signal DIP[n] to the first variable capacitance 105p and a multiple-bit control signal DIN[n] to the second variable capacitance 105n. A capacitance value of the first variable capacitance 105p varies depending on the multiple-bit control signal DIP[n]. A capacitance value of the second variable capacitance 105n varies depending on the multiple-bit control signal DIN[n].

A threshold of the comparator system can be set by changing a capacitance value of the first variable capacitance 105p or the second variable capacitance 105n. When a threshold of the comparator system is 0V, the comparator system outputs a high level to the output node DO when an input voltage of the third input node VIP is higher than an input voltage of the fourth input node VIN and a low level to the output node DO when the input voltage of the third input node VIP is lower than the input voltage of the fourth input node VIN.

In addition, when a threshold of the comparator system is −10 mV, the comparator system outputs a high level to the output node DO when a voltage obtained by adding −10 mv to an input voltage of the third input node VIP is higher than an input voltage of the fourth input node VIN and a low level to the output node DO when the voltage obtained by adding −10 mv to the input voltage of the third input node VIP is lower than the input voltage of the fourth input node VIN.

In addition, when a threshold of the comparator system is +10 mV, the comparator system outputs a high level to the output node DO when a voltage obtained by adding +10 mV to an input voltage of the third input node VIP is higher than an input voltage of the fourth input node VIN and a low level to the output node DO when the voltage obtained by adding +10 mV to the input voltage of the third input node VIP is lower than the input voltage of the fourth input node VIN.

Figure 2:
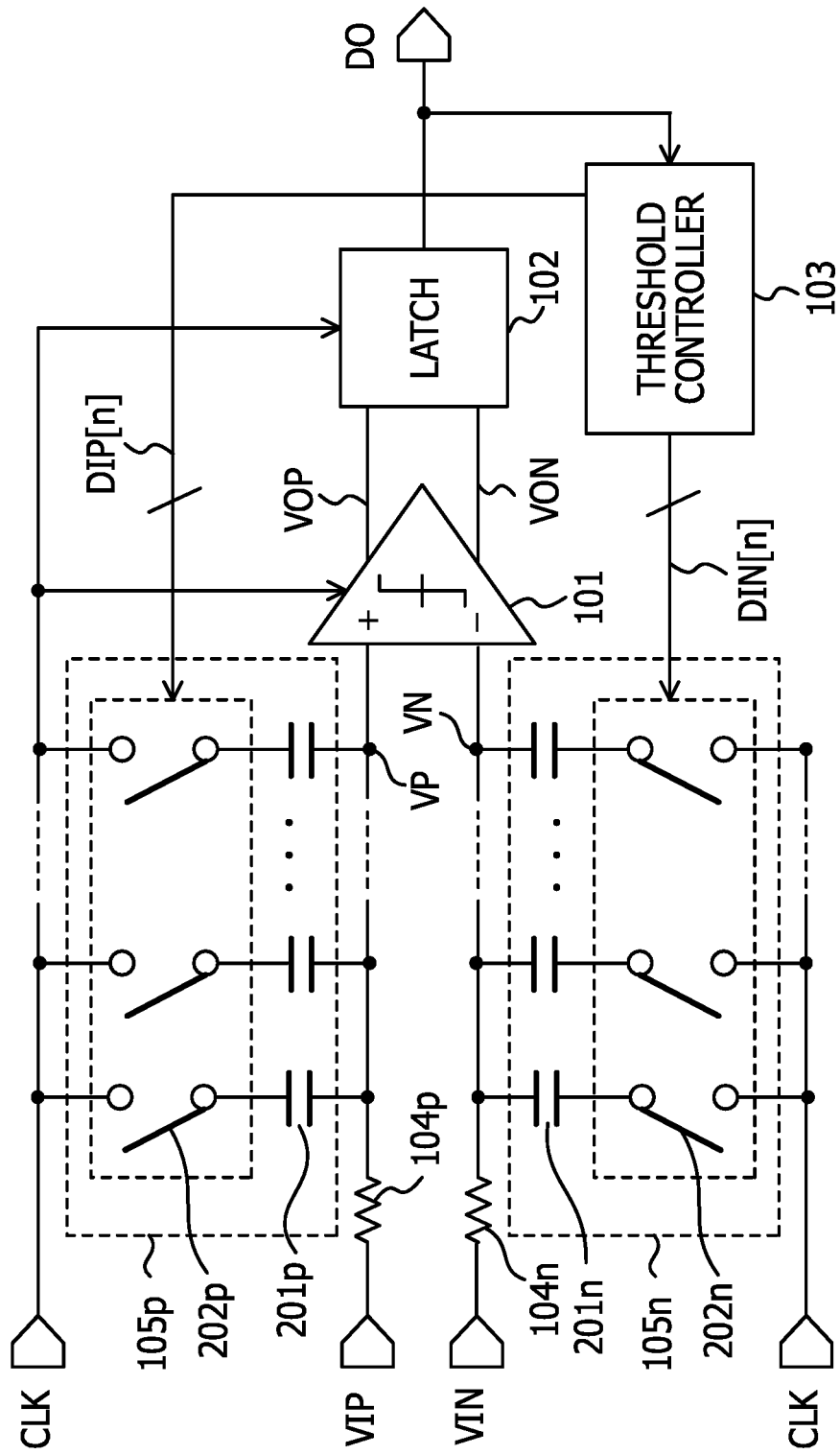
FIG. 2 is a view illustrating a configuration example of a first variable capacitance and a second variable capacitance of FIG. 1.

FIG. 2 is a view illustrating a configuration example of the first variable capacitance 105p and the second variable capacitance 105n of FIG. 1. The first variable capacitance 105p has a plurality of series-connected circuits each including a switch 202p and a capacitance 201p. The plurality of series-connected circuits of the switch 202p and the capacitance 201p are connected in parallel between the clock node CLK and the first input node VP. The multiple-bit control signal DIP[n] controls switching ON/OFF of a plurality of the switches 202p. Of the plurality of switches 202p, when the number of switches to turn ON is large, a capacitance value of the first variable capacitance 105p is large, and when the number of switches to turn ON is small, the capacitance value of the first variable capacitance 105p is small. A plurality of the capacitances 201p may all have a same capacitance value or a capacitance value of a power of 2 such as once, double, quadruple, octuple and the like.

The second variable capacitance 105n has a plurality of series-connected circuits each including a switch 202n and a capacitance 201n. The plurality of series-connected circuits of the switch 202n and the capacitance 201n are connected in parallel between the cock node CLK and the second input node VN. The multiple-bit control signal DIN[n] controls switching ON/OFF of a plurality of the switches 202n. Of the plurality of switches 202n, when the number of switches to turn ON is large, a capacitance value of the second variable capacitance 105n is large, and when the number of switches to turn ON is small, the capacitance value of the second variable capacitance 105n is small. A plurality of the capacitances 201n may all have a same capacitance value or a capacitance value of a power of 2 such as once, double, quadruple, octuple and the like.

Figure 3:
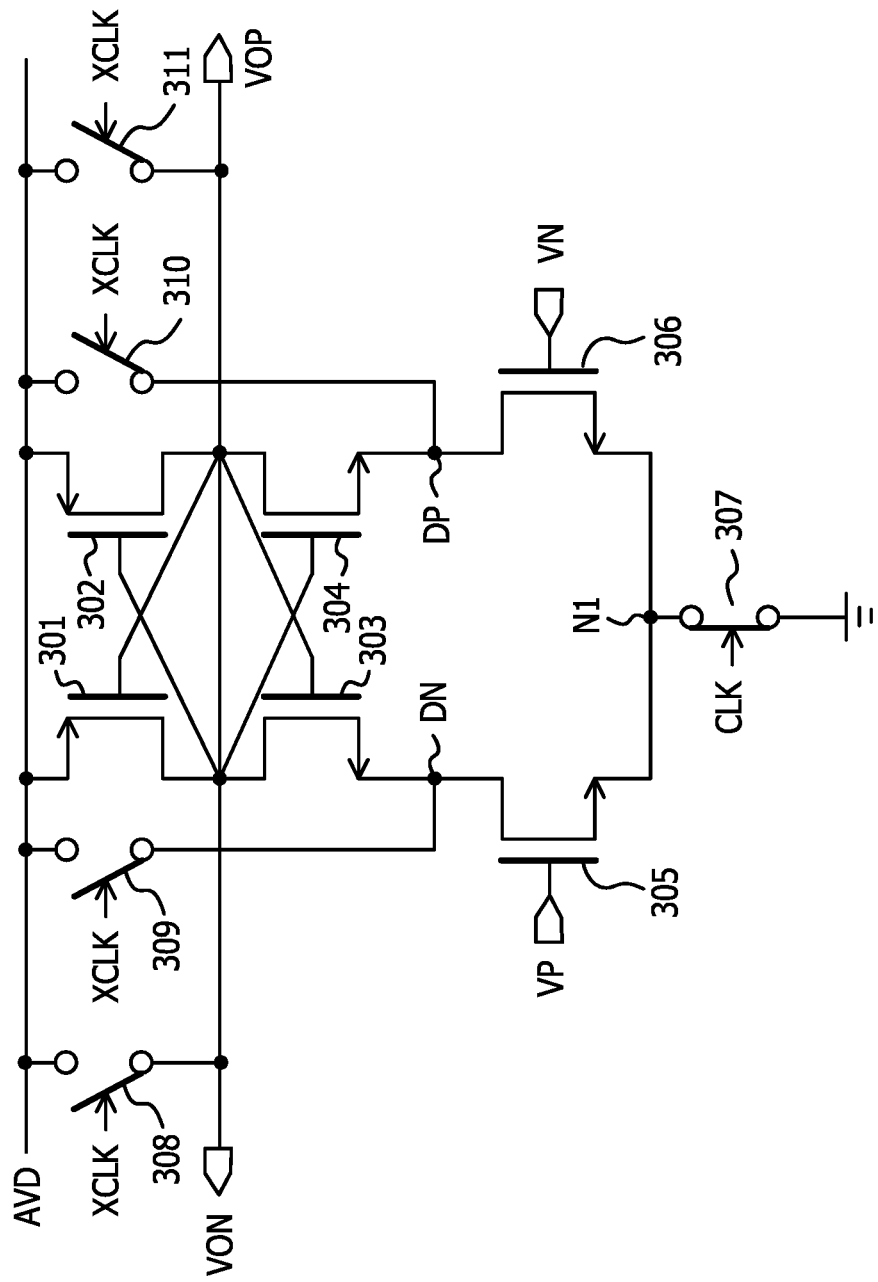
FIG. 3 is a view illustrating a configuration example of the comparator of FIG. 1.

FIG. 3 is a view illustrating a configuration example of the comparator 101 of FIG. 1. A p-channel field effect transistor 301 has a source connected to a power supply potential node AVD, a gate connected to the first output node VOP, and a drain connected to the second output node VON. A p-channel field effect transistor 302 has a source connected to the power supply potential node AVD, a gate connected to the second output node VON, and a drain connected to the first output node VOP. An n-channel field effect transistor 303 has a drain connected to the second output node VON, a gate connected to the first output node VOP, and a source connected to a node DN. An n-channel field effect transistor 304 has a drain connected to the first output node VOP, a gate connected to the second output node VON, and the source connected to a node DP.

An n-channel field effect transistor 305 has a drain connected to the node DN, a gate connected to the first input node VP, and a source connected to a node N1. An n-channel field effect transistor 306 has a drain connected to the node DP, a gate connected to the second input node VN, and a source connected to the node N1. A switch 307 is connected between the node N1 and a grand potential node, and turns ON when a clock signal of the clock node CLK is at high level and turns OFF when the clock signal of the clock node CLK is at low level.

A clock signal XCLK indicates a logic inversion signal of a clock signal of the clock node CLK. A switch 308 is connected between the power supply potential node AVD and the second output node VON, and turns OFF when a clock signal of the clock node CLK is at high level and ON when the clock signal of the clock node CLK is at low level. A switch 309 is connected between the power supply potential node AVD and the node DN, and turns OFF when a clock signal of the clock node CLK is at high level and ON when the clock signal of the clock node CLK is at low level. A switch 310 is connected between the power supply potential node AVD and the node DP, and turns OFF when a clock signal of the clock node CLK is at high level and ON when the clock signal of the clock node CLK is at low level. A switch 311 is connected between the power supply potential node AVD and the first output node VOP, and turns OFF when a clock signal of the clock node CLK is at high level and ON when the clock signal of the clock node CLK is at low level.

In a period during which a clock signal of the clock node CLK is at high level, when a voltage of the first input node VP is higher than a voltage of the second input node VN, the first output node VOP goes to high level and the second output node VON goes to low level. When the voltage of the first input node VP is lower than the voltage of the second input node VN, the first output node VOP goes to low level and the second output node VON goes to high level. In contrast to this, in a period during which a clock signal of the clock node CLK is at low level, the first output node VOP and the second output node VON are fixed at high level.

Figure 4:
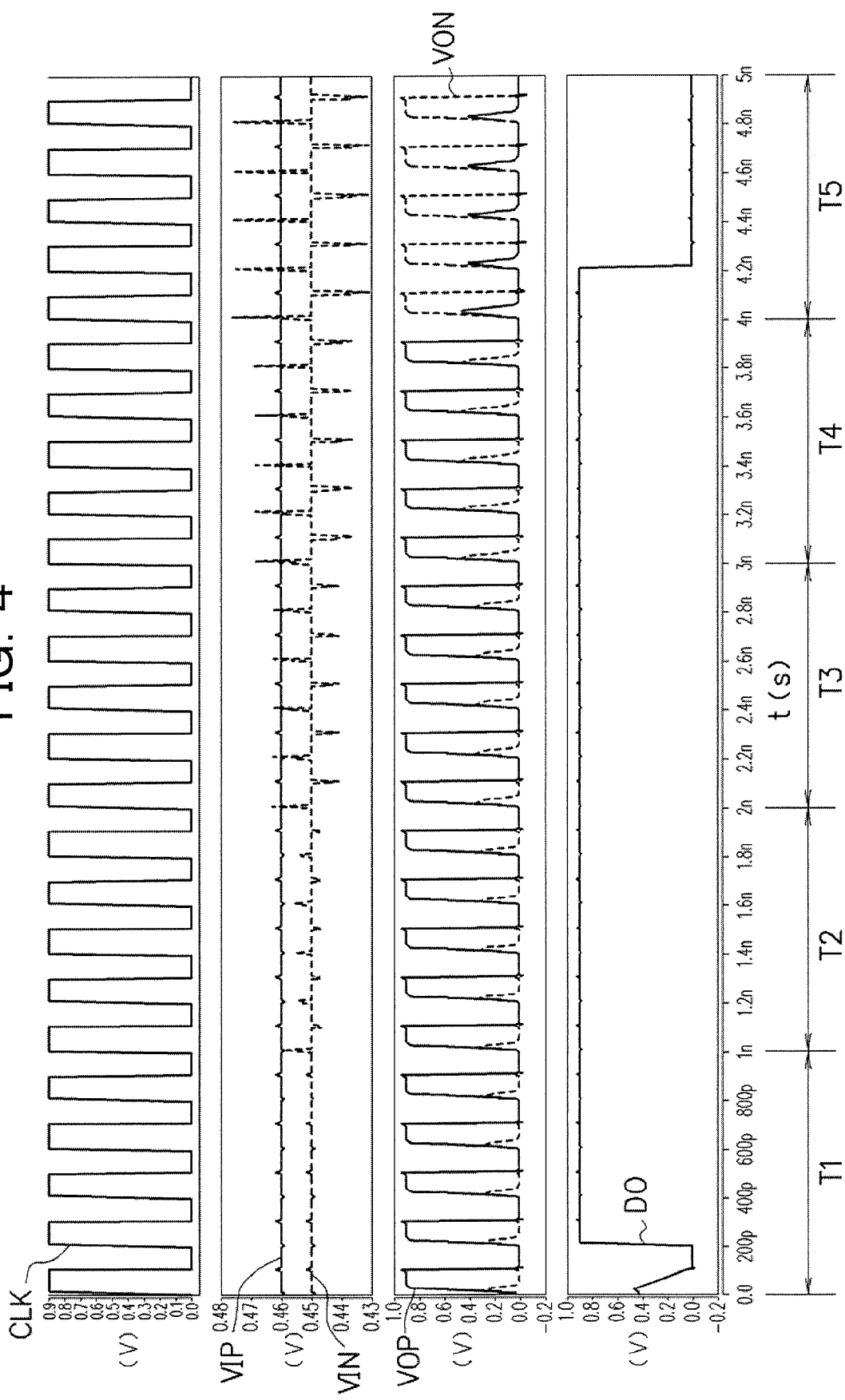
FIG. 4 is a timing chart illustrating a processing method of a comparator system in calibration mode when a negative threshold is set.
Figure 5:
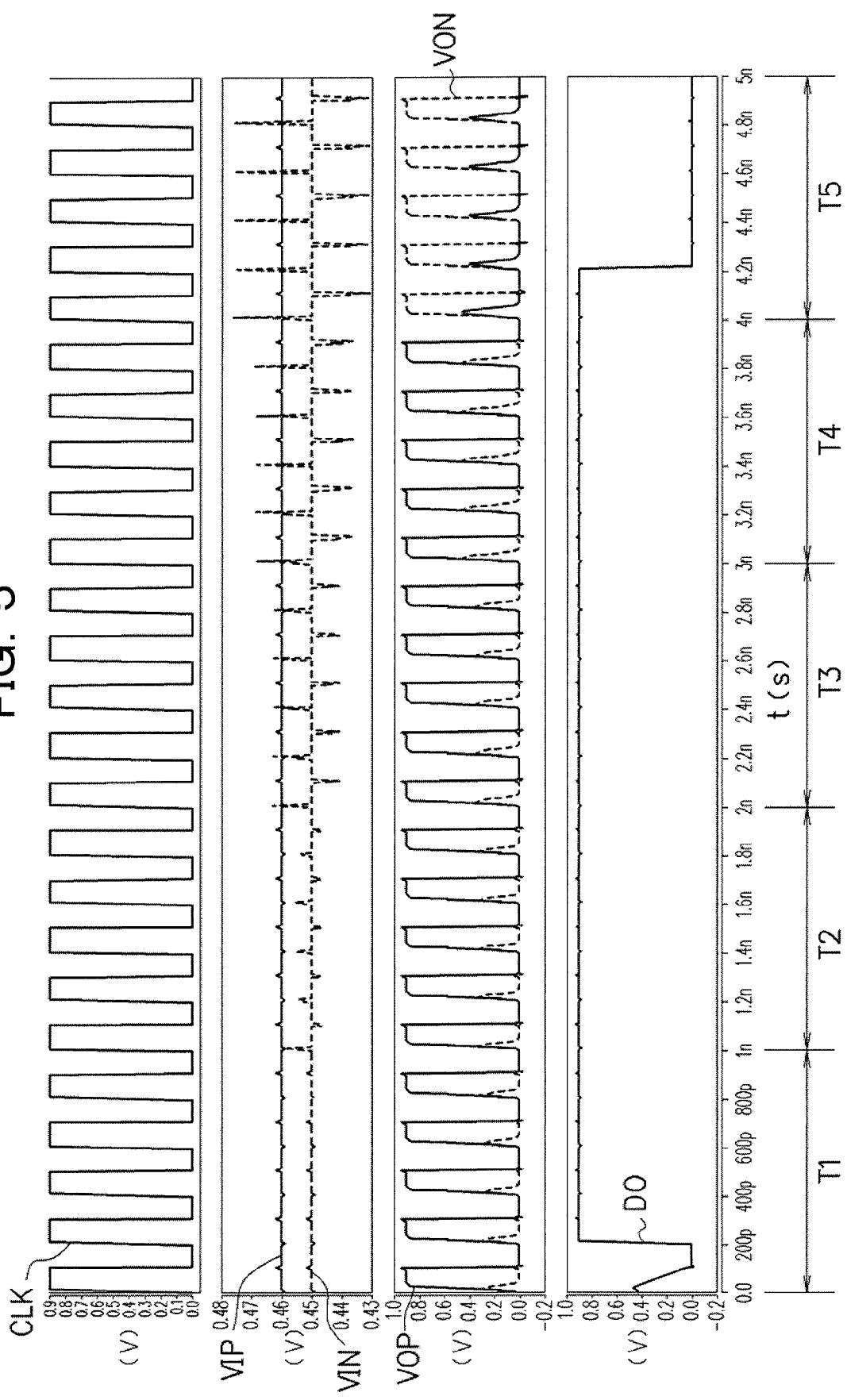
FIG. 5 is a timing chart illustrating a processing method of a comparator system in calibration mode when a positive threshold is set.
Figure 6:
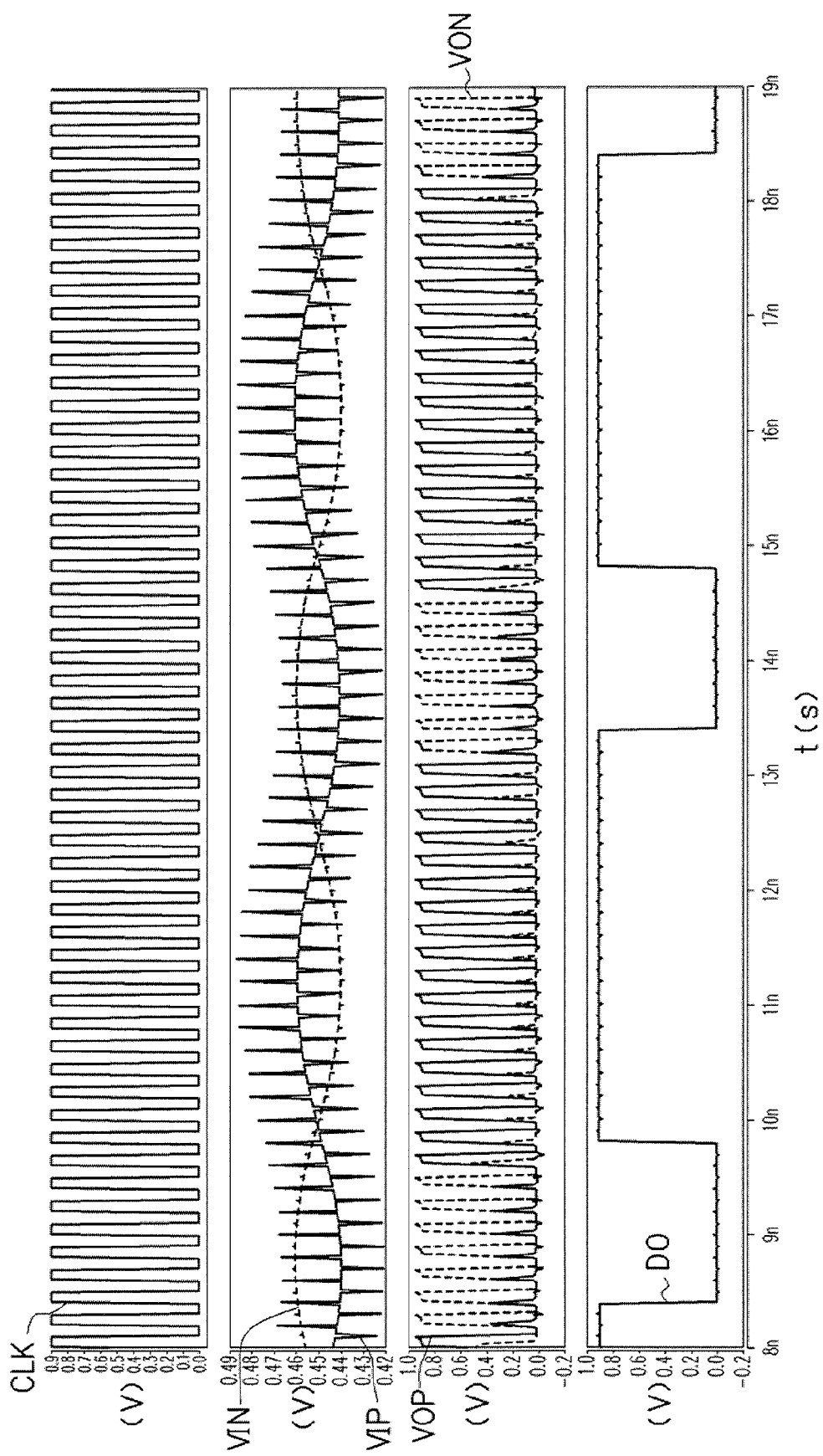
FIG. 6 is a timing chart illustrating a processing method of a comparator system in operation mode for which a threshold has been set.

Note that FIG. 4 to FIG. 6 illustrate an example in which the comparator 101 fixes the first output node VOP and the second output node VON at low level in the period during which the clock signal of the clock node CLK is at low level.

Due to variations of a transistor, asymmetry of layout or the like, the comparator 101 has an offset voltage which adversely affects circuit operations. The offset voltage can be corrected by setting of a threshold. It is also desirable to make it possible to set the threshold of a comparator without generating a reference voltage.

A processing method of a comparator system is described hereinafter. First, in calibration mode of FIG. 4 or FIG. 5, the comparator system performs a setting process of the first variable capacitance 105p and the second variable capacitance 105n. Then, in operation mode of FIG. 6, the comparator system performs normal comparator operations.

FIG. 4 is a timing chart illustrating a processing method of the comparator system in the calibration mode when a negative threshold is set. A first reference voltage (450 mV, for example) is inputted to the third input node VIP. A second reference voltage (460 mV, for example) is inputted to the fourth input node VIN. The first reference voltage (450 mV, for example) is a voltage obtained by adding a negative threshold (−10 mV, for example) to the second reference voltage (460 mV, for example). In the period of T1 to T5, the threshold controller 103 turns OFF all switches of the plurality of switches 202n with the multiple-bit control signal DIN[n].

In the period T1, the threshold controller 103 turns OFF all switches of the plurality of switches 202p with the multiple-bit control signal DIP[n]. In the period during which a clock signal of the clock node CLK is at high level, since a voltage of the input node VIP (VP) is lower than a voltage of the input node VIN (VN), the comparator 101 outputs a low level to the first output node VOP and a high level to the second output node VON. The latch circuit 102 latches the low level and outputs the low level to the output node DO.

Then, in the period T2, the threshold controller 103 turns ON only one switch of the plurality of switches 202p with the multiple-bit control signal DIP[n]. Since the input node VIP (VP) is connected to the clock node CLK by way of the first variable capacitance 105p, a change in the rising edge and falling edge of a clock signal of the clock node CLK is transmitted to the input node VIP (VP) as an impulse-like signal.

However, since a capacitance value of the first variable capacitance 105p is small, the impulse-like signal of the input node VIP (VP) is small. In the period during which a clock signal of the lock node CLK is at high level, since a voltage of the input node VIP (VP) is lower than a voltage of the input node VIN (VN), the comparator 101 outputs a low level to the first output node VOP and a high level to the second output node VON. The latch circuit 102 latches the low level and outputs the low level to the output node DO. Since a signal of the output node DO is maintained at the low level, then, transition is made to processing of the next period T3.

In the period T3, the threshold controller 103 turns ON only two switches of the plurality of switches 202p with the multiple-bit control signal DIP[n]. A capacitance value of the first variable capacitance 105p in the period T3 is larger than the capacitance value of the first variable capacitance 105p in the period of T2. Accordingly, an impulse-like signal of the input node VIP (VP) in the period T3 is larger than the impulse-like signal of the input node VIP (VP) in the period T2. In the period during which a clock signal of the clock node CLK is at high level, since a voltage of the input node VIP (VP) is lower than a voltage of the input node VIN (VN), the comparator 101 outputs a low level to the first output node VOP and a high level to the second output node VON. The latch circuit 102 latches the low level and outputs the low level to the output node DO. Since the signal of the output node DO is maintained at the low level, transition is made to processing of the next period T4.

In the period T4, the threshold controller 103 turns ON only three switches of the plurality of switches 202p with the multiple-bit control signal DIP[n]. A capacitance value of the first variable capacitance 105p in the period T4 is larger than the capacitance value of the first variable capacitance 105p in the period T3. Accordingly, an impulse-like signal of the input node VIP (VP) in the period T4 is larger than the impulse-like signal of the input node VIP (VP) in the period T3.

In the period during which a clock signal of the clock node CLK is at high level, since a voltage of the input node VIP (VP) is lower than a voltage of the input node VIN (VN), the comparator 101 outputs a low level to the first output node VOP and a high level to the second output node VON. The latch circuit 102 latches the low level and outputs the low level to the output node DO. Since the signal of the output node DO is maintained at the low level, transition is made to processing of the next period T5.

In the period T5, the threshold controller 103 turns ON only four switches of the plurality of switches 202p with the multiple-bit control signal DIP[n]. A capacitance value of the first variable capacitance 105p in the period T5 is larger than the capacitance value of the first variable capacitance 105p in the period T4. Accordingly, an impulse-like signal of the input node VIP (VP) in the period T5 is larger than the impulse-like signal of the input node VIP (VP) in the period T4. In the period during which a clock signal of the clock node CLK is at high level, since a voltage of the input node VIP (VP) is higher than a voltage of the input node VIN (VN), the comparator 101 outputs a high level to the first output node VOP and a low level to the second output node VON. The latch circuit 102 latches the high level and outputs the high level to the output node DO. Since the signal of the output node DO is inverted from the low level to the high level, the threshold controller 103 stores and maintains the multiple-bit control signals DIP[n] and DIN[n] of the period T5. Thus, a capacitance value of the first variable capacitance 105p is set and a negative threshold (−10 mV, for example) is set. With the above, the calibration mode ends and shifts to the operation mode in FIG. 6.

FIG. 5 is a timing chart illustrating a processing method of the comparator system in calibration mode when a positive threshold is set. A first reference voltage (460 mV, for example) is inputted to the third input node VIP. A second reference voltage (450 mV, for example) is inputted to the fourth input node VIN. The first reference voltage (460 mV, for example) is a voltage obtained by adding a positive threshold (+10 mV, for example) to the second reference voltage (450 mV, for example). In the period of T1 to T5, the threshold controller 103 turns OFF all switches of the plurality of switches 202p with the multiple-bit control signal DIP[n].

In the period T1, the threshold controller 103 turns OFF all switches of the plurality of switches 202n with the multiple-bit control signal DIN[n]. In the period during which a clock signal of the clock node CLK is at high level, since a voltage of the input node VIP (VP) is higher than a voltage of the input node VIN (VN), the comparator 101 outputs a high level to the first output node VOP and a low level to the second output node VON. The latch circuit 102 latches the high level and outputs the high level to the output node DO.

Then, in the period T2, the threshold controller 103 turns ON only one switch of the plurality of switches 202n with the multiple-bit control signal DIN[n]. Since the input node VIN (VN) is connected to the clock node CLK by way of the second variable capacitance 105n, a change in the rising edge and falling edge of a clock signal of the clock node CLK is transmitted to the input node VIN (VN) as an impulse-like signal. However, since a capacitance value of the second variable capacitance 105n is small, the impulse-like signal of the input node VIN (VN) is small. In the period during which a clock signal of the lock node CLK is at high level, since a voltage of the input node VIP (VP) is higher than a voltage of the input node VIN (VN), the comparator 101 outputs a high level to the first output node VOP and a low level to the second output node VON. The latch circuit 102 latches the high level and outputs the high level to the output node DO. Since a signal of the output node DO is maintained at the high level, then, transition is made to processing of the next period T3.

In the period T3, the threshold controller 103 turns ON only two switches of the plurality of switches 202n with the multiple-bit control signal DIN[n]. A capacitance value of the second variable capacitance 105n in the period T3 is larger than the capacitance value of the second variable capacitance 105n in the period of T2.

Accordingly, an impulse-like signal of the input node VIN (VN) in the period T3 is larger than the impulse-like signal of the input node VIN (VN) in the period T2. In the period during which a clock signal of the clock node CLK is at high level, since a voltage of the input node VIP (VP) is higher than a voltage of the input node VIN (VN), the comparator 101 outputs a high level to the first output node VOP and a low level to the second output node VON. The latch circuit 102 latches the high level and outputs the high level to the output node DO. Since the signal of the output node DO is maintained at the high level, transition is made to processing of the next period T4.

In the period T4, the threshold controller 103 turns ON only three switches of the plurality of switches 202n with the multiple-bit control signal DIN[n]. A capacitance value of the second variable capacitance 105n in the period T4 is larger than the capacitance value of the second variable capacitance 105n in the period T3. Accordingly, an impulse-like signal of the input node VIN (VN) in the period T4 is larger than the impulse-like signal of the input node VIN (VN) in the period T3. In the period during which a clock signal of the clock node CLK is at high level, since a voltage of the input node VIP (VP) is higher than a voltage of the input node VIN (VN), the comparator 101 outputs a high level to the first output node VOP and a low level to the second output node VON. The latch circuit 102 latches the high level and outputs the high level to the output node DO. Since the signal of the output node DO is maintained at the high level, transition is made to processing of the next period T5.

In the period T5, the threshold controller 103 turns ON only four switches of the plurality of switches 202n with the multiple-bit control signal DIN[n]. A capacitance value of the second variable capacitance 105n in the period T5 is larger than the capacitance value of the second variable capacitance 105n in the period T4. Accordingly, an impulse-like signal of the input node VIN (VN) in the period T5 is larger than the impulse-like signal of the input node VIN (VN) in the period T4.

In the period during which a clock signal of the clock node CLK is at high level, since a voltage of the input node VIP (VP) is lower than a voltage of the input node VIN (VN), the comparator 101 outputs a low level to the first output node VOP and a high level to the second output node VON. The latch circuit 102 latches the low level and outputs the low level to the output node DO. Since the signal of the output node DO is inverted from the high level to the low level, the threshold controller 103 stores and maintains the multiple-bit control signals DIN[n] and DIP[n] of the period T5. Thus, a capacitance value of the second variable capacitance 105n is set and a positive threshold (+10 mV, for example) is set. With the above, the calibration mode ends and shifts to the operation mode (FIG. 6).

FIG. 6 is a timing chart illustrating a processing method of a comparator system in operation mode for which a threshold has been set. FIG. 6 illustrates processing of the operation mode after a negative threshold (−10 mV, for example) has been set by the processing of the calibration mode in FIG. 4. A clock signal of 5 GHz is supplied to the clock node CLK. An example is illustrated in which a sinusoidal signal of 200 MHz with a different phase is inputted to the third input node VIP and the fourth input node VIN. The sinusoidal signal has a peak-to-peak value of 30 mV and a direct-current component of 450 mV.

In a period during which the voltage obtained by adding the threshold (−10 mV) to the input voltage of the third input node VIP is higher than the input voltage of the fourth input node VIN, the comparator 101 outputs a high level to the first output node VOP and a low level to the second output node VON while a clock signal of the clock node CLK is at high level. In that case, the latch circuit 102 latches the high level and outputs the high level to the output node DO.

In addition, in a period during which the voltage obtained by adding the threshold (−10 mV) to the input voltage of the third input node VIP is lower than the input voltage of the fourth input node VIN, the comparator 101 outputs a low level to the first output node VOP and a high level to the second output node VON while a clock signal of the clock node CLK is at high level. In that case, the latch circuit 102 latches the low level and outputs the low level to the output node DO.

As described above, in the calibration mode of FIG. 4, while inputting a first reference voltage to the input node VIP (VP) and inputting a second reference voltage, which is higher than the first reference voltage, to the input node VIN (VN), the threshold controller 103 changes a capacitance value of the first variable capacitance 105p and detects the capacitance value of the first variable capacitance 105p at a limit at which the logic of an output signal of the comparator 101 is inverted. Then, in the operation mode of FIG. 6, the threshold controller 103 sets a negative threshold for the comparator system by maintaining the detected capacitance value of the first variable capacitance 105p.

In addition, in the calibration mode of FIG. 5, while inputting a first reference voltage to the input node VIP (VP) and inputting a second reference voltage, which is lower than the first reference voltage, to the input node VIN (VN), the threshold controller 103 changes a capacitance value of the second variable capacitance 105n and detects the capacitance value of the second variable capacitance 105n at a limit at which the logic of the output signal of the comparator 101 is inverted. Then, in the operation mode (FIG. 6), the threshold controller 103 sets a positive threshold for the comparator system by maintaining the detected capacitance value of the second variable capacitance 105n.

In this embodiment, a negative threshold is set by controlling the first variable capacitance 105p and a positive threshold is set by controlling the second variable capacitance 105n. Therefore, when only a negative threshold is set, the first variable capacitance 105p has only to be controlled, and the second variable capacitance 105n may thus be deleted. On the other hand, when only a positive threshold is set, the second variable capacitance 105n has only to be controlled, and the first variable capacitance 105p may thus be deleted.

In this embodiment, changing of a capacitance value of the first variable capacitance 105p or the second variable capacitance 105n enables setting of a threshold of the comparator system. In addition, since the first variable capacitance 105p and the second variable capacitance 105n do not affect load of the comparator 101, the operating speed of the comparator 101 may be increased. A comparator of FIG. 7 is described hereinafter in order to explain why the comparator system of the embodiment operates at high speed.

Figure 7:
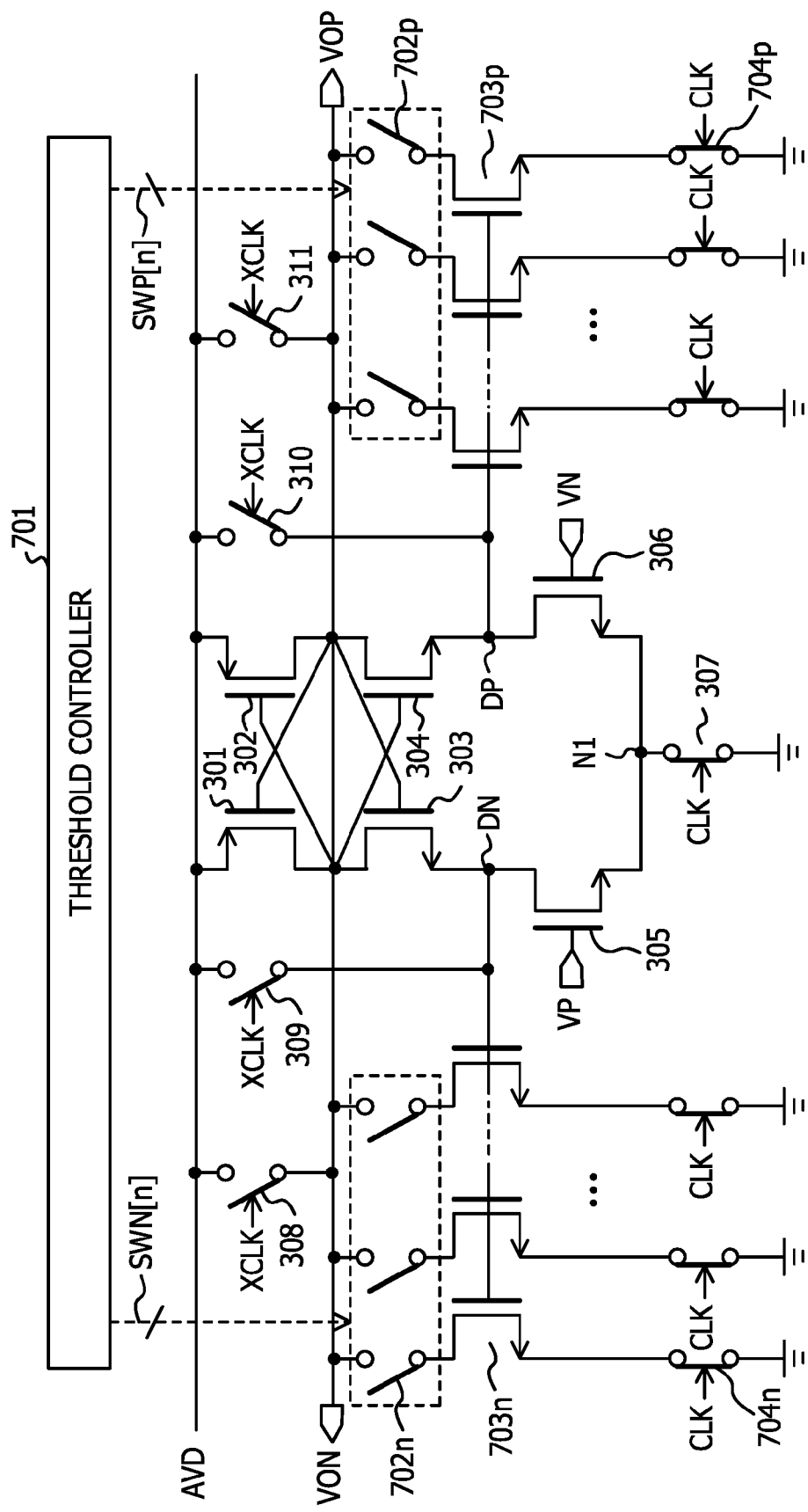
FIG. 7 is a view illustrating a configuration example of a comparator for which a threshold may be set.

FIG. 7 is a view illustrating a configuration example of a comparator capable of setting a threshold. The comparator in FIG. 7 is a comparator by adding to the comparator 101 in FIG. 3 a threshold controller 701, a plurality of switches 702p, a plurality of n-channel field effect transistors 703p, a plurality of switches 704p, a plurality of switches 702n, a plurality of n-channel field effect transistors 703n, and a plurality of switches 704n. The threshold controller 701 controls switching ON/OFF of the plurality of switches 702p with a multiple-bit control signal SWP[n] and switching ON/OFF of the plurality of switches 702n with a multiple-bit control signal SWN[n]. The switches 704p and 704n turn ON when a clock signal of a clock node CLK is at high level and OFF when the clock signal of the clock node CLK is at low level.

The threshold controller 701 may set a threshold by controlling the number of switches to turn ON of the plurality of switches 702p or the number of switches to turn ON of the plurality of switches 702n. The n-channel field effect transistor 703p connected to a first output node VOP extracts charges of the first output node VOP to the grand potential node, depending on an input voltage of the second input node VN. In addition, the n-channel field effect transistor 703n connected to the second output node VON extracts charges of the second output node VON to the grand potential node depending on an input voltage of the first input node VP. The threshold controller 701 controlling the number of switches 702p to turn ON or the number of switches 702n to turn ON, the amount of charges to be extracted varies, enabling a threshold to be changed.

However, since a gate of the n-channel field effect transistor 703p is connected to the node DP and a gate of the n-channel field effect transistor 703n is connected to the node DN, a gate capacitance of the n-channel field effect transistors 703p and 703n acts as a load capacity of the comparator, which lowers the operating speed of the comparator. In addition, the switches 702p and 702n act as load capacities of the output nodes VOP and VON, respectively. In addition, since the comparator in FIG. 7 includes a larger number of devices and nodes, parasitic capacitance due to the layout increases. Consequently, the operating speed of the comparator is lowered.

In contrast to this, in this embodiment (FIG. 1), the first variable capacitance 105p and the second variable capacitance 105n are connected to the first input node VP and the second input node VN, respectively, and do not affect the load of the comparator 101. Thus, the operating speed of the comparator 101 may be increased.

Figure 8:
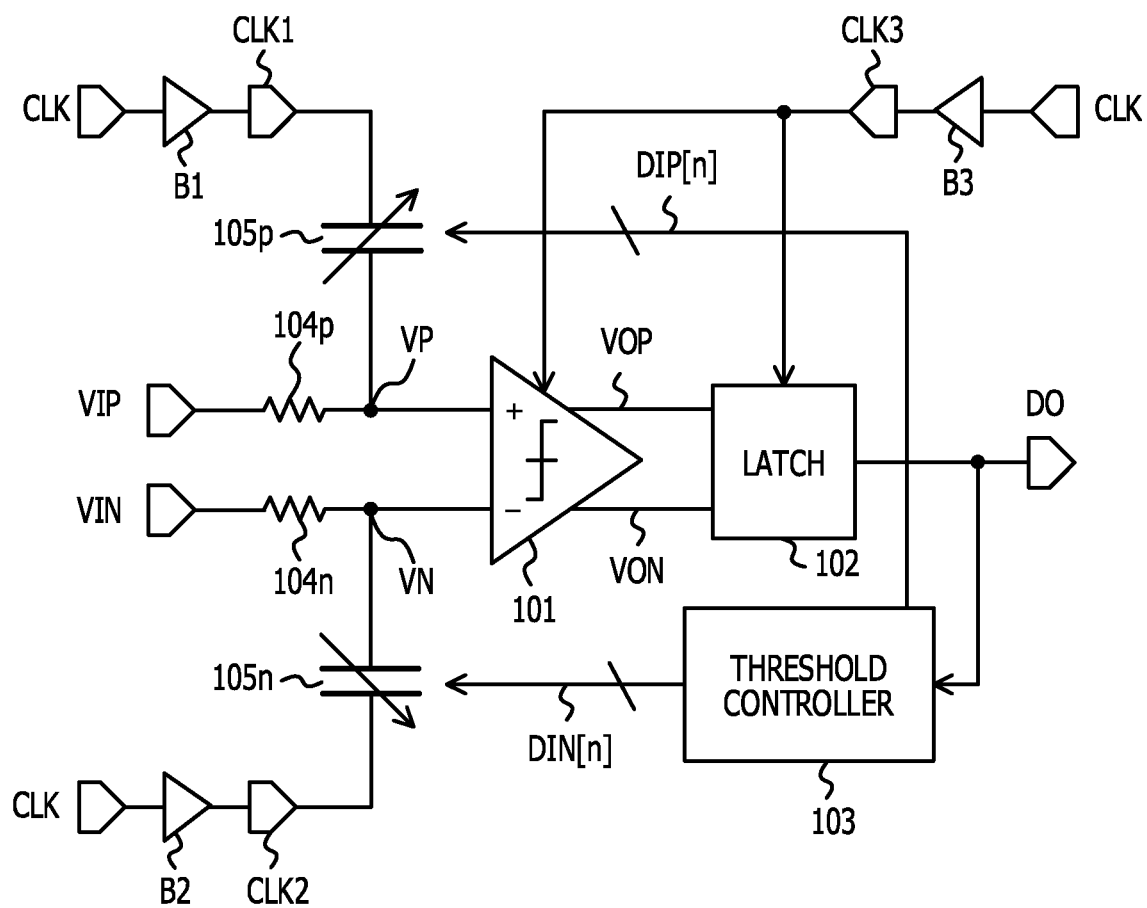
FIG. 8 is a view illustrating a configuration example of a comparator system according to other embodiment.

FIG. 8 is a view illustrating a configuration example of a comparator system according to other embodiment. FIG. 1 illustrates an example in which the first variable capacitance 105p, the second variable capacitance 105n, the comparator 101, and the latch circuit 102 are connected to the same clock node CLK. In FIG. 8, a first variable capacitance 105p is connected to a first clock node CLK1, a second variable capacitance 105n is connected to a second clock node CLK2, and the comparator 101 and a latch circuit 102 are connected to a third clock node CLK3. Differences of FIG. 8 from FIG. 1 are described hereinafter. The first variable capacitance 105p is connected between the first clock node CLK1 and the first input node VP. The second variable capacitance 105n is connected between the second clock node CLK2 and the second input node VN.

A clock terminal of the comparator 101 and a clock terminal of the latch circuit 102 are connected to the third clock node CLK3. A clock buffer B1 has an input terminal connected to the clock node CLK and an output terminal connected to the first clock node CLK1. A clock buffer B2 has an input terminal connected to the clock node CLK and an output terminal connected to the second clock node CLK2.

A clock buffer B3 has an input terminal connected to the clock node CLK and an output terminal connected to the third clock node CLK3. The clock buffers B1 to B3 are provided for waveform shaping, amplification and the like of clock signals of the clock nodes CLK1 to CLK3 in order to make the clock signals in phase. In the case of adjusting the phases of the clock signals, different numbers of clock buffers may be connected to the clock nodes CLK1 to CLK3. Note that the clock nodes CLK1 and CLK2 may be made common, the clock nodes CLK1 and CLK3 may be made common, or the clock nodes CLK2 and CLK3 may be made common.

Figure 9:
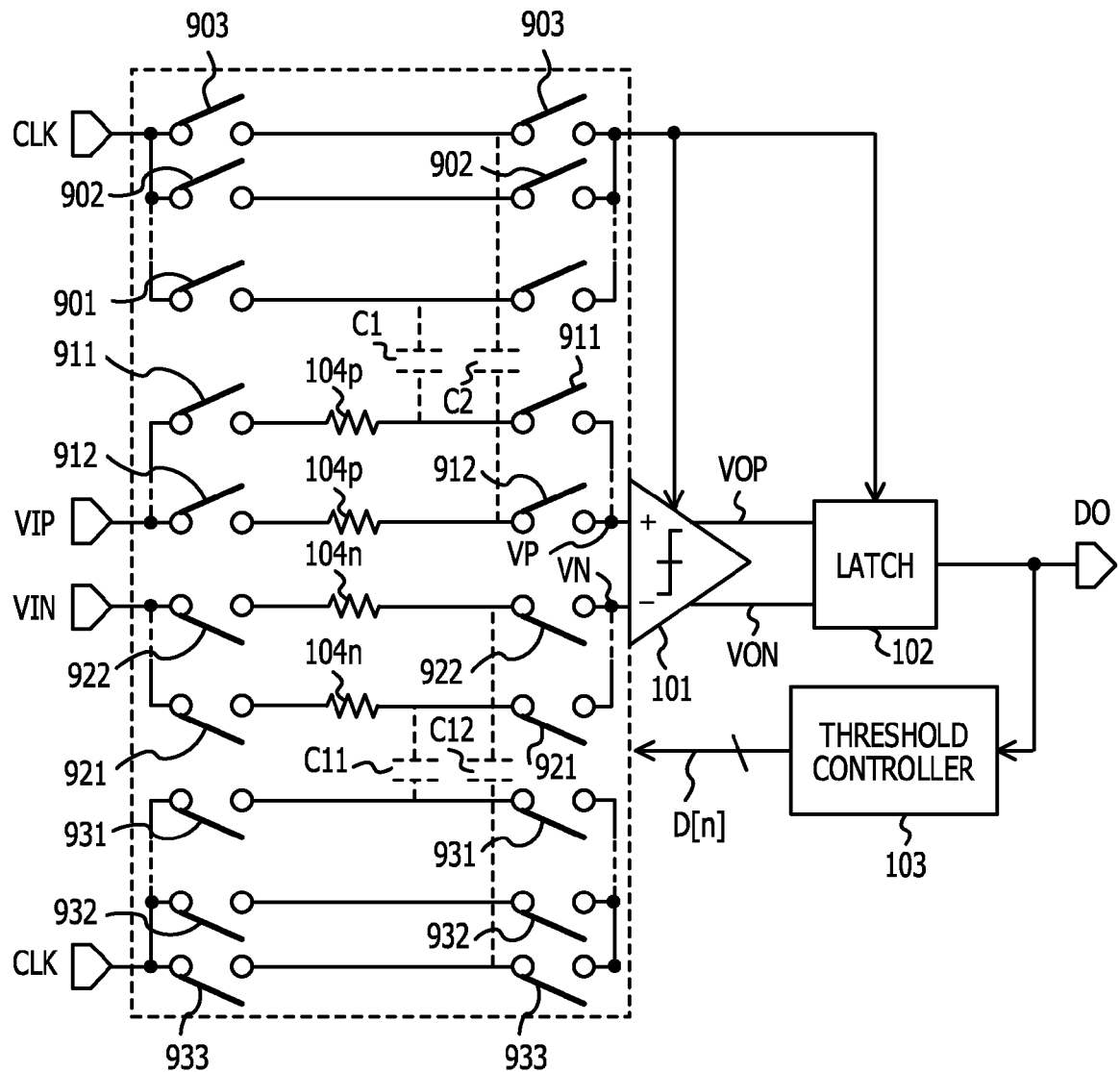
FIG. 9 is a view illustrating other configuration example of the first variable capacitance and the second variable capacitance of FIG. 1.

FIG. 9 is a view illustrating other configuration example of the first variable capacitance 105p and the second variable capacitance 105n of FIG. 1. Differences of FIG. 9 from FIG. 1 are described hereinafter. A wire connected between two switches 901 is a wire close to the first input node VP and connected between the clock node CLK, the comparator 101, and the latch circuit 102 by the two switches 901. A wire connected between two switches 903 is a wire far from the first input node VP and connected between the clock node CLK, the comparator 101, and the latch circuit 102 by the two switches 903. A wire connected between two switches 902 is a wire having a medium distance with respect to the first input node VP and connected between the clock node CLK, the comparator 101, and the latch circuit 102 by the two switches 902.

A wire connected between two switches 911 is a wire close to the clock node CLK, has a wiring resistance 104p and connected between the third input node VIP and the first input node VP by the two switches 911. A wire connected between two switches 912 is a wire far from the clock node CLK, has a wiring resistance of 104p, and is connected between the third input node VIP and the first input node VP by the two switches 912.

A wire connected between two switches 931 is a wire close to the second input node VN. A wire connected between two switches 933 is a wire far from the second input node VN. A wire connected between two switches 932 is a wire having a medium distance with respect to the second input node VN.

A wire connected between two switches 921 is a wire close to the clock node CLK, has a wiring resistance 104n, and is connected between the fourth input node VIN and the second input node VN by the two switches 921. A wire connected between two switches 922 is a wire far from the clock node CLK, has a wiring resistance 104n, and is connected between the fourth input node VIN and the second input node VN by the two switches 922.

The threshold controller 103 turns ON the two switches 901 and the two switches 911 with the multiple-bit control signal D[n], and turns OFF other switches. Then, the wire between the two switches 901 is connected to the clock node CLK and the wiring of the two switches 911 is connected between the input nodes VIP and the VP. A parasitic capacitance C1 is present between the wiring of the two switches 901 and the wiring of the two switches 911. The parasitic capacitance C1 corresponds to the first variable capacitance 105p of FIG. 1. Since a distance between the wiring of the two switches 901 and the wiring of the two switches 911 is close, a capacitance value of the parasitic capacitance C1 is relatively large. More specifically, a capacitance value of the first variable capacitance 105p may be increased.

In addition, the threshold controller 103 turns ON the two switches 903 and the two switches 912 with the multiple-bit control signal D[n] and OFF other switches. Then, the wire between the two switches 903 is connected to the clock node CLK, and the wiring of the two switches 912 is connected between the input nodes VIP and VP.

A parasitic capacitance C2 is present between the wiring of the two switches 903 and the wiring of the two switches 912. The parasitic capacitance C2 corresponds to the first variable capacitance 105p of FIG. 1. Since a distance between the wiring of the two switches 903 and the wiring of the two switches 912 is far, a capacitance value of the parasitic capacitance C2 is relatively small. More specifically, a capacitance value of the first variable capacitance 105p may be reduced. As described above, the threshold controller 103 may change a capacitance value of the first variable capacitance 105p by controlling the switches 901 to 903, 911 and 912 with the multiple-bit control signal D[n].

In addition, the threshold controller 103 turns ON the two switches 931 and the two switches 921 with the multiple-bit control signal D[n], and turns OFF other switches. Then, the wire between the two switches 931 is connected to the clock node CLK and the wiring of the two switches 921 is connected between the input nodes VIN and the VN. A parasitic capacitance C11 is present between the wiring of the two switches 931 and the wiring of the two switches 921. The parasitic capacitance C11 corresponds to the second variable capacitance 105n of FIG. 1. Since a distance between the wiring of the two switches 931 and the wiring of the two switches 921 is close, a capacitance value of the parasitic capacitance C11 is relatively large. More specifically, a capacitance value of the second variable capacitance 105n may be increased.

In addition, the threshold controller 103 turns ON the two switches 933 and the two switches 922 with the multiple-bit control signal D[n] and OFF other switches. Then, the wire between the two switches 933 is connected to the clock node CLK, and the wiring of the two switches 922 is connected between the input nodes VIN and VN. A parasitic capacitance C12 is present between the wiring of the two switches 933 and the wiring of the two switches 922. The parasitic capacitance C12 corresponds to the second variable capacitance 105n of FIG. 1. Since a distance between the wiring of the two switches 933 and the wiring of the two switches 922 is far, a capacitance value of the parasitic capacitance C12 is relatively small. More specifically, a capacitance value of the second variable capacitance 105n may be reduced. As described above, the threshold controller 103 may change a capacitance value of the second variable capacitance 105n by controlling the switches 921, 922, 931 to 933 with the multiple-bit control signal D[n].

As described above, the first variable capacitance 105p changes a parasitic capacitance between the wire connected to the clock node CLK and the wire connected to the first input node VP by changing a distance between the wire connected to the clock node CLK and the wire connected to the first input node VP. In addition, the second variable capacitance 105n changes a parasitic capacitance between the wire connected to the clock node CLK and the wire connected to the second input node VN by changing a distance between the wire connected to the clock node CLK and the wire connected to the second input node VN.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A comparator system, comprising:
a clock node configured to supply a clock signal;
a comparator configured to compare a signal of a first input node with a signal of a second input node in synchronization with the clock signal; and
a first variable capacitance coupled between the first input node and the clock node.

2. The comparator system according to claim 1, wherein the first input node is coupled to a positive-electrode input terminal of the comparator; and
the second input node is coupled to a negative-electrode input terminal of the comparator.

3. The comparator system according to claim 1, wherein the first input node is coupled to a negative-electrode input terminal of the comparator; and
the second input node is coupled to a positive-electrode input terminal of the comparator.

4. The comparator system according to claim 1, further comprising:
a second variable capacitance coupled between the second input node and the clock node.

5. The comparator system according to claim 1, wherein the first variable capacitance has a plurality of circuits in each of which a switch and a capacitance is series-coupled.

6. The comparator system according to claim 1, wherein the first variable capacitance changes a parasitic capacitance between a wire coupled to the clock node and a wire coupled to the first input node by changing a distance between the wire coupled to the clock node and the wire coupled to the first input node.

7. The comparator system according to claim 4, wherein the clock node has a first clock node, a second clock node, and a third clock node,
the first variable capacitance is coupled between the first clock node and the first input node;
the second variable capacitance is coupled between the second clock node and the second input node; and
a clock terminal of the comparator is coupled to the third clock node.

8. The comparator system according to claim 1, further comprising a controller configured to:
in calibration mode, change a capacitance value of the first variable capacitance while inputting a first reference voltage to the first input node and inputting a second reference voltage to the second input node, and detect the capacitance value of the first variable capacitance at a limit at which logic of an output signal of the comparator is inverted; and
in operation mode, maintain the detected capacitance value of the first variable capacitance.

9. The comparator system according to claim 4, further comprising:

a controller configured to control the first variable capacitance and the second variable capacitance; wherein the first input node is coupled to a positive-electrode input terminal of the comparator, the second input node is coupled to a negative-electrode input terminal of the comparator, and the controller is configured to:

in calibration mode, change a capacitance value of the first variable capacitance while inputting a first reference voltage to the first input node and inputting a second reference voltage higher than the first reference voltage to the second input node, and detect the capacitance value of the first variable capacitance at a limit at which logic of an output signal of the comparator is inverted, and in operation mode, set a negative threshold for the comparator system by maintaining the detected capacitance value of the first variable capacitance; and in the calibration mode, change a capacitance value of the second variable capacitance while inputting a first reference voltage to the first input node and inputting a second reference voltage lower than the first reference voltage to the second input node, and detect the capacitance value of the second variable capacitance at the limit at which the logic of the output signal of the comparator is inverted, and in the operation mode, set a positive threshold for the comparator system by maintaining the detected capacitance value of the second variable capacitance.

10. The comparator system according to claim 1, further comprising:

a first resistance coupled between the first input node and a third input node; and a second resistance coupled between the second input node and a fourth input node.

* * * * *